(12) United States Patent
Baschirotto et al.

(10) Patent No.: US 7,176,754 B2
(45) Date of Patent: Feb. 13, 2007

(54) CONTROL SYSTEM FOR THE CHARACTERISTIC PARAMETERS OF AN ACTIVE FILTER

(75) Inventors: Andrea Baschirotto, Tortona (IT); Pietro Liguori, Binasco (IT); Vittorio Colonna, Landriano (IT); Gabriele Gandolfi, Siziano (IT)

(73) Assignee: STMicroelectronics, S.r.l. (IT)

( * ) Notice: Subject to any disclaimer, the term of this patent is extended or adjusted under 35 U.S.C. 154(b) by 0 days.

(21) Appl. No.: 10/787,819

(22) Filed: Feb. 26, 2004

(65) Prior Publication Data

US 2004/0183625 A1   Sep. 23, 2004

(30) Foreign Application Priority Data

Feb. 26, 2003  (EP)  ................... 03425120

(51) Int. Cl.
*H03K 5/00*  (2006.01)
(52) U.S. Cl. ...................... 327/553; 327/308
(58) Field of Classification Search ........ 327/552–559, 327/308; 330/305; 333/81 R
See application file for complete search history.

(56) References Cited

U.S. PATENT DOCUMENTS

| | | | |
|---|---|---|---|
| 5,336,242 A * | 8/1994 | Zadeh | 607/11 |
| 6,417,737 B1 | 7/2002 | Moloudi | |
| 6,628,163 B2 * | 9/2003 | Dathe et al. | 327/553 |
| 6,677,814 B2 * | 1/2004 | Low et al. | 327/554 |
| 6,710,644 B2 * | 3/2004 | Duncan et al. | 327/558 |
| 6,842,710 B1 * | 1/2005 | Gehring et al. | 702/107 |

FOREIGN PATENT DOCUMENTS

| | | |
|---|---|---|
| EP | 0 669 712 A | 4/1999 |
| EP | 0 910 165 A | 4/1999 |

OTHER PUBLICATIONS

J B Hughes et al: "Self-tuned RC-Active Filters for VLSI" Electronics Letters, vol. 22, No. 19, Sep. 11, 1986, pp. 993-994; XP001149985.
European Search Report dated Jul. 17, 2003.

* cited by examiner

*Primary Examiner*—Dinh T. Le
(74) *Attorney, Agent, or Firm*—Lisa K. Jorgenson; J. Mark Han; Graybeal Jackson Haley LLP

(57) ABSTRACT

A control system for the characteristic parameters of an active filter includes: a system for the determination of the technological distribution of the components that provides the information related to said technological distribution of the components; an elaboration system for said information related to said technological distribution of the components; an active filter including at least two programmable passive circuital elements receiving said information related to said technological distribution of the components; said elaboration system, being aware of the topology for said active filter, comprises means for determining the value for said at least two programmable passive circuital elements; means for correcting the value for said at least two programmable passive circuital elements according to the value of the information related to said technological distribution of the components; means for determining the programming values for said at least two programmable passive circuital elements.

3 Claims, 2 Drawing Sheets

CONTROL SYSTEM FOR THE CHARACTERISTIC PARAMETERS OF AN ACTIVE FILTER

PRIORITY CLAIM

This application claims priority from European patent application No. 03425120.7, filed Feb. 26, 2003, which is incorporated herein by reference.

TECHNICAL FIELD

An embodiment of the present invention is directed to a control system and method for controlling the characteristic parameters of an active filter.

BACKGROUND

Active filters are normally realized with different techniques and topologies.

A known filter solution is, for instance, that of a RC active filter that uses a biquadratic cell with two operational amplifiers.

The characteristic parameters of a filter are the gain A0, the cutoff frequency $\omega 0$ and the quality factor Q.

Because of the technological variations of the components used (normally realized by integrated circuits) the above-mentioned parameters can vary and differ from their design nominal value. For this reason a control system to adapt their values is often necessary.

In the specific case of a RC active filter that uses a biquadratic cell with two operational amplifiers, and also in other cases, it is possible to modify the characteristic parameters of a filter by modifying three different components.

In other cases, for instance, for filters that use only one operational amplifier, the value of the three above mentioned parameters (A0, $\omega 0$, Q) depends on the same components, so that by modifying a parameter the value of the other two also changes.

SUMMARY

An embodiment of the present invention provides a control system for the characteristic parameters of an active filter that does not have the drawbacks of the known art.

According to an embodiment of the present invention, the control system for the characteristic parameters of an active filter comprises: a system for the determination of the component technological distribution that provides the information related to said component technological distribution; an elaboration system for said information related to said component technological distribution; an active filter including at least two programmable passive circuital elements receiving said information related to said component technological distribution; said elaboration system, being aware of the topology of said active filter, comprises means for determining the value of said at least two programmable passive circuital elements; means for correcting the value of said at least two programmable passive circuital elements according to the value of the information related to said component technological distribution; means for determining the programming values of said at least two programmable passive circuital elements.

According to an other embodiment of the present invention, a control method for the characteristic parameters of an active filter comprises: a system for the determination of the component technological distribution that provides the information related to said component technological distribution; an elaboration system for said information related to said component technological distribution; an active filter including at least two programmable passive circuital elements receiving said information related to said component technological distribution; said elaboration system, being aware of the topology of said active filter, determines the value of said at least two programmable passive circuital elements; it corrects the value of said at least two programmable passive circuital elements according to the value of the information related to said component technological distribution; it determines the programming values of said at least two programmable passive circuital elements.

In an embodiment of the present invention it is possible to realize a control system for the characteristic parameters of an active filter which is able to set the component values in order to get the required characteristic parameters of a filter. That is, a system can be realized that is able to determine the component technological distribution. The information so obtained will make the working of the system more efficient. But advance knowledge of some quantitative characteristics of the transfer function associated with the filter may be needed.

DESCRIPTION OF DRAWINGS

Features and the advantages of the present invention will be made more evident by the following detailed description of embodiments thereof illustrated as a non-limiting example in the annexed drawings, wherein.

DETAILED DESCRIPTION

Figure 1:
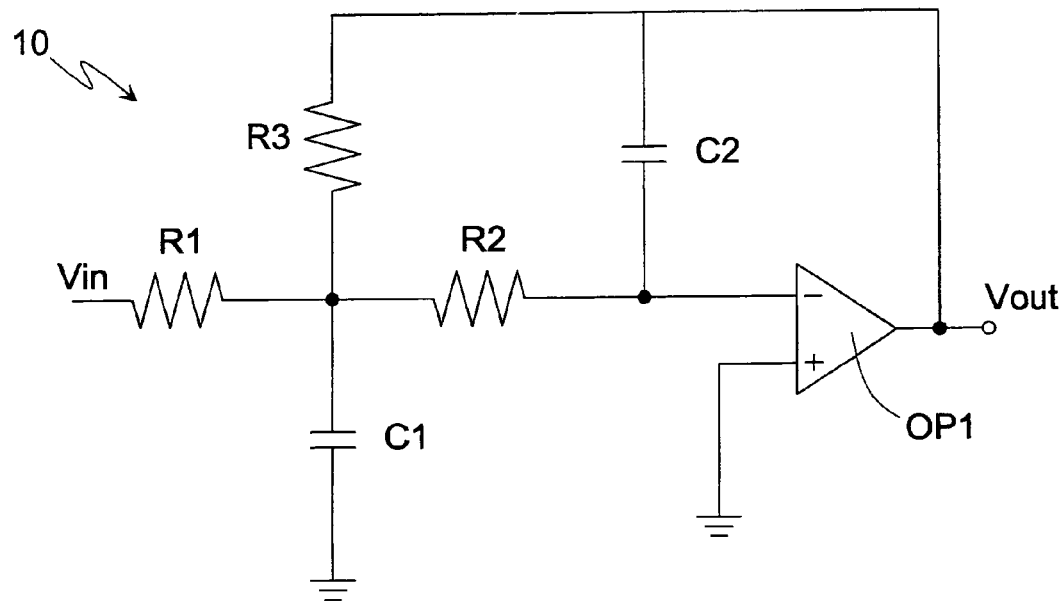
FIG. 1 represents an active filter with a single operational amplifier according to an embodiment of the invention.

In FIG. 1 a biquadratic cell 10 is represented with only one operational amplifier OP1. Particularly it is a low-pass filter. Embodiments of the present invention are also applicable to other filters either of different type (band-pass, high-pass) or of different topology with a single operational amplifier.

The voltage Vin is applied to the resistance R1, that is connected to a capacitor C1 connected to ground, to a resistance R3 connected to the output of the operational amplifier OP1, and to a resistance R2 connected to the inverting input of the operational amplifier OP1. Between the inverting input of the operational amplifier OP1 and its output, a capacitor C2 is connected. The non-inverting input of the operational amplifier OP1 is connected to ground. The output of the operational amplifier OP1 provides the voltage Vout.

The transfer function of the circuit of FIG. 1 is the following:

$$\frac{V_{out}}{V_{in}} = -\frac{\frac{1}{R1 \cdot R2 \cdot C1 \cdot C2}}{s^2 + s \cdot \frac{1}{C1} \cdot \left(\frac{1}{R1} + \frac{1}{R2} + \frac{1}{R3}\right) + \frac{1}{R2 \cdot R3 \cdot C1 \cdot C2}}$$

The characteristic parameters of the circuit of FIG. 1, that is the gain A0, the cutting frequency ω0 and the merit factor Q, are the following.

$$A_0 = -\frac{R3}{R1}$$

$$\omega_0 = \sqrt{\frac{1}{R2 \cdot R3 \cdot C1 \cdot C2}}$$

$$Q = \frac{\sqrt{\frac{C1}{C2}}}{\sqrt{\frac{R2}{R3}} + \sqrt{\frac{R3}{R2}} + \frac{\sqrt{R2 \cdot R3}}{R1}}$$

As can be seen, the parameters A0, ω0, and Q depend on the values of the components, and by regulating the value of one component, the change of the three parameters is thus obtained.

From the above equations the following values R1, R2 and R3 are obtained.

$$R1 = \frac{1 \pm \sqrt{1 - 4Q^2(1 + |A_0|)\frac{C2}{C1}}}{2Q\omega|A_0|C_2}$$

$$R2 = \frac{2Q}{\omega C_1 \left(1 \pm \sqrt{1 - 4Q^2(1 + |A_0|)\frac{C2}{C1}}\right)}$$

$$R3 = \frac{1 \pm \sqrt{1 - 4Q^2(1 + |A_0|)\frac{C2}{C1}}}{2Q\omega C2}$$

Figure 2:
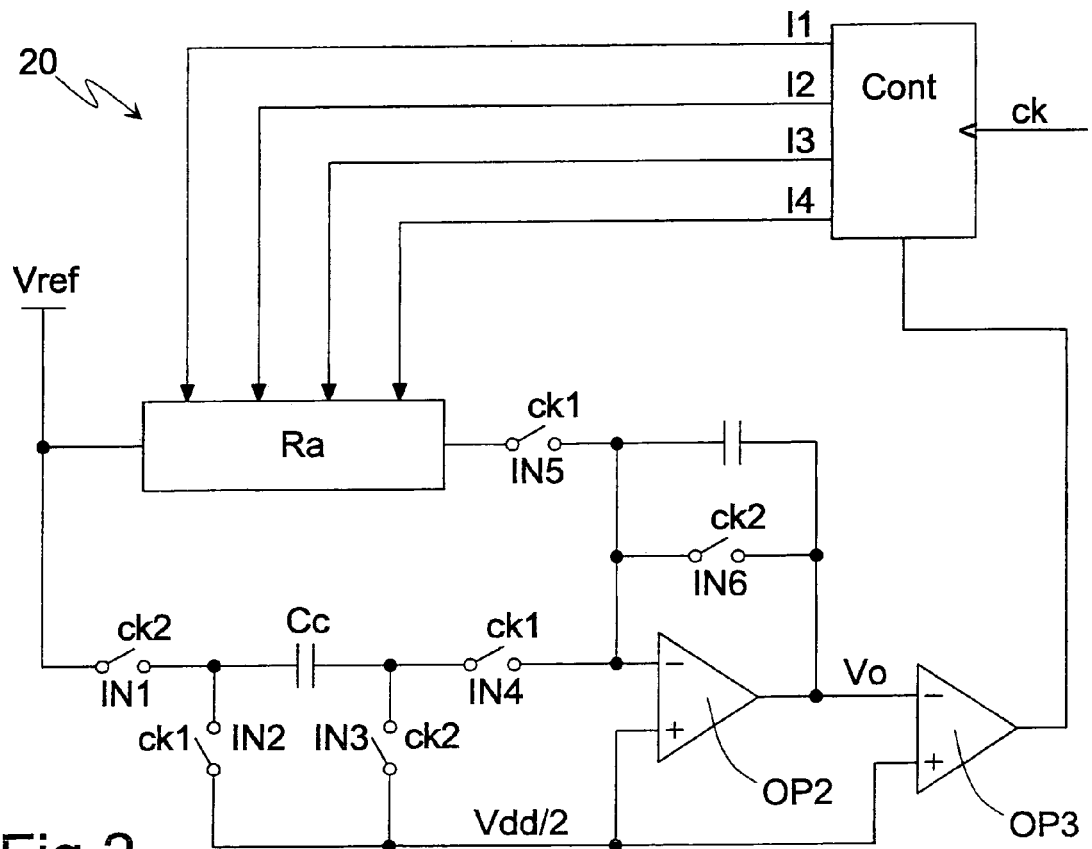
FIG. 2 represents a system according to an embodiment of the invention for the determination of the component technological distribution of the filter of FIG. 1.

We refer now to FIG. 2 that represents a system 20 for the determination of the component technological distribution.

A voltage Vref is applied to a terminal of a resistance array Ra and to a controlled switch IN1 connected to a controlled switch IN2 and to a capacitor Cc. The capacitor Cc is connected in turn to a controlled switch IN3 and to a controlled switch IN4. The switches IN2 and IN3 are connected to the non-inverting input of an operational OP2, to the non-inverting input of an operational OP3 and to a voltage Vdd/2.

The switch IN4 is connected to the inverting input of the operational OP2, to a controlled switch IN6, to a controlled switch IN5 and to a capacitor Cf. The controlled switch IN6, in parallel to the capacitor Cf, is connected to the output of the operational OP2 and to the inverting input of the operational OP3. The switch IN5 is connected to the other terminal of the resistance array Ra.

The switches IN2, IN4 and IN5 are controlled by a square wave signal ck1. The switches IN1, IN3 and IN6 are controlled by a square wave signal ck2.

The output of the operational OP3 is applied to the input of an up-down counter Cont at four bits, having a synchronism signal ck. It provides the output signals I1–I4, applied to the resistance array Ra.

Figure 3:
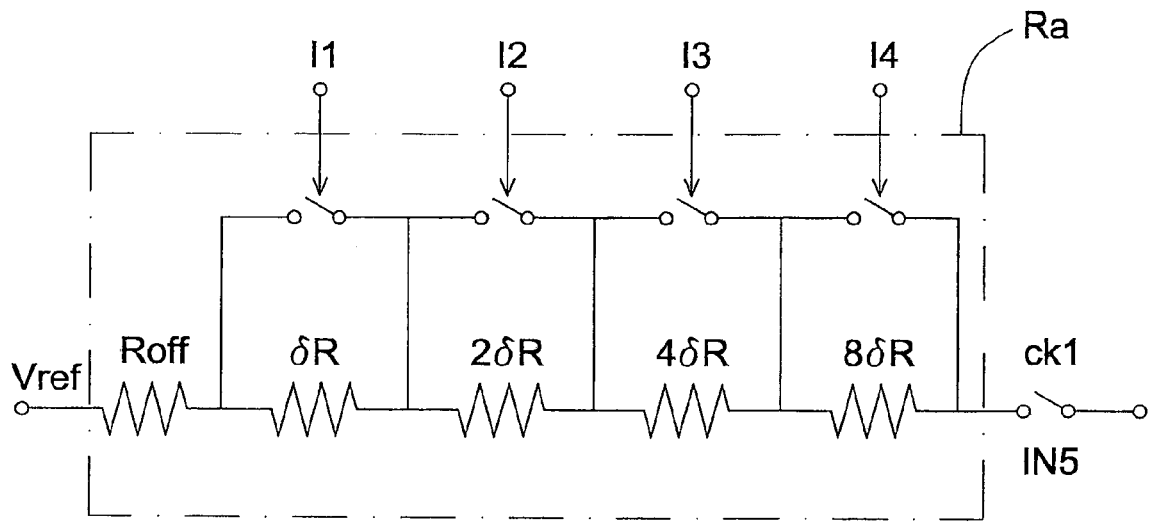
FIG. 3 represents an embodiment of the resistance array illustrated in FIG. 2.

The resistance array Ra is shown in FIG. 3. It is preferably composed of five resistances Roff, δR, 2δR, 4δR, 8δR, placed in series, and four switches respectively controlled by signals I1–I4, that connect or disconnects the resistances δR, 2δR, 4δR, 8δR from the resistance array Ra.

Referring to FIG. 2, the charge quantity injected by the switched capacitor Cc is proportional to the reference voltage Vref, while the current flowing in the array Ra, besides depending on Vref, also depends on the resistance value of Ra. From the difference of these signals, the signal error is obtained, integrated by the capacitor Cf placed as feedback to the operational OP2. Then at the circuit output, since in input there is a constant voltage, there results a voltage ramp.

Having chosen the value of the reference voltage Vref and the capacitor Cf, the slope of the voltage ramp depends only on the array Ra.

The output Vo is compared with the voltage Vdd/2, through a comparator (the operational OP3), so as to have the variation sign to be set to the array Ra, in order to guarantee equality with the reference voltage Vref. The sign (represented by a 0 or a 1) controls an N-bit UP-DOWN counter Cont, where N is the number of resistances that constitute the array Ra. In presence of a 1 the calculation is increased by increasing its value; with a 0 the back calculation is determined by decreasing its value. The switch IN6 in parallel with the operational OP3 is used to periodically discharge (with ck2) the present charge on Cf in order to be able to integrate only that one effectively injected. The system 20 is timed with two synchronism signals ck1 and ck2, one complementary to the other but of a small hysteresis.

In this way it is possible to tie the possible combinations at the output of the counter Cont to a corresponding number of levels of the technological distribution of the component values.

The array Ra is controlled by the counter Cont so as to introduce an overall resistance as close as possible to the nominal one chosen, keeping in mind that the resistances composing it also have the same degree of standard deviation. The resistances of Ra, therefore, will have to introduce resistance values as to be able to recompose the nominal value in each case.

The array Ra is structured with a series of five resistances of which four can be short-circuited by the counter. The resistance Roff avoids the short circuit when the outputs of the counter are all low. To perform the sizing it is enough to know the value of Roff and δR; in fact, the other resistances are multiples of the first one.

The value of the array Ra is given by the following formula.

$$R_a = (1+\epsilon) \cdot (R_{off} + n\delta R)$$

Where $\epsilon$ represents the standard deviation of the technological distribution of the components and n the decimal equivalent of the calculation of the counter Cont.

Then, one considers the following expressions.

$$R_{off}(1-\epsilon) < R_{nom}$$

$$(R_{off}+15\delta R)(1-\epsilon) > R_{nom}$$

$$R_{off}(1+\epsilon) < R_{nom}$$

$$(R_{off}+15\delta R)(1+\epsilon) > R_{nom}$$

Where Rnom is the required (nominal) resistance value.
Resolving these expressions obtains the following.

$$R_{off} < \frac{R_{nom}}{1+\varepsilon}$$

$$\delta R > \frac{1}{15} \cdot \left(\frac{R_{nom}}{1-\varepsilon}\right) - R_{off}$$

Figure 4:
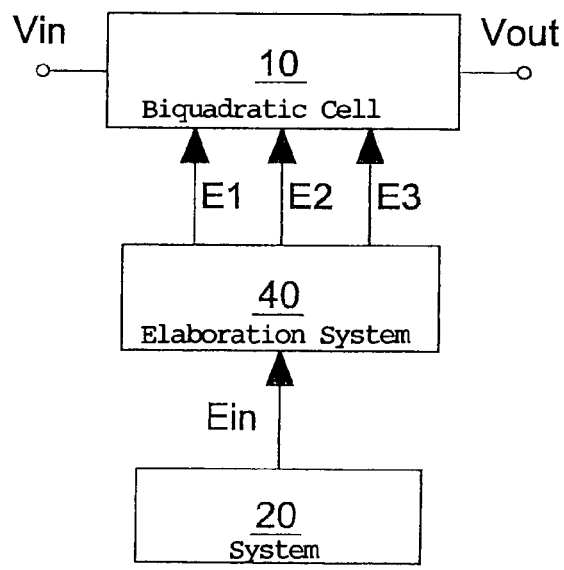
FIG. 4 represents a block diagram of a control system for the characteristic parameters of an active filter according to an embodiment of the present invention.

We now consider FIG. 4, which is a block diagram of a control system for the characteristic parameters of an active filter according to an embodiment of the present invention. It shows a system 20 (FIG. 2) for the determination of the technological distribution of the components that provides a digital signal Ein at n bits to an elaboration system 40, that provides three digital signals E1, E2 and E3 each at n bits to a biquadratic cell 10 with only one operational amplifier OP1 like that of FIG. 1. The biquadratic cell 10, in this embodiment replacing the resistances R1, R2, and R3, has three resistance arrays Ra of the type of that of FIG. 3 controlled by the three digital signals E1, E2 and E3.

From the information of the signal Ein, the elaboration system 40 determines the digital values of the signals E1, E2 and E3 that will determine the correct value of the resistances R1, R2 and R3, to eliminate the error due to the technology distribution and to plan the value of the desired parameters A0, ω0, Q.

According to the Ein value (and that is n) and to that of the array Ra, through the following formula $$R_a = (1+\varepsilon) \cdot (R_{off} + n\delta R)$$

the value of the standard deviation $\varepsilon$ of the technological distribution of the components can be determined.

The values of R1, R2 and of R3 are determined through the above-mentioned formulas, they are corrected in order to take into account the standard deviation $\varepsilon$, and the values R1c, R2c and R3c are determined, through the following formula $$R_{nc} = \frac{R_n}{1+\varepsilon}$$

where Rnc is the corrected resistance n and Rn the resistance n to be corrected.

The just-calculated values are those that we have to be able to reconstruct, considering that the resistances, effectively realized on the silicon, are really different of an amount equal to $\varepsilon$. So it is worthwhile to look for a resistive value that, varied according to the distribution, gives us the above-mentioned resistances.

For each resistance, the value which E1, E2 and E3 should assume are able to effect the resistance in question with the elements of the arrays. The knowledge of such signals allows us to realize a resistance of the wanted value.

Being aware of the nominal values of the resistances that compose the arrays Ra of the resistances R1, R2 and R3, by varying the possibilities offered by the signals E1, E2 and E3, a digital word is chosen for every resistance that closes the appropriate switches so as to produce the desired resistance.

By an array Ra formed by a fixed resistance and four resistances controllably connectable it is possible to choose a resistance among the 16 possible.

In other words the nominal value of the resistances Rnc, previously calculated, with the value obtainable by applying the different digital words (E1–E3) is compared with the arrays Ra, that represent the resistances R1–R3, and the nearest value (at minimum distance) to the wanted nominal value is chosen.

It is possible to apply this method also to passive circuital elements of a different type (for instance, capacitors), or to maintain fixed a passive element and to program, according to an embodiment of the present invention, the other two passive elements.

The filter 10 may be disposed on an integrated circuit, which one may incorporate into an electronic system.

What is claimed is:

1. A method for controlling characteristic parameters of an active filter having an operational amplifier and a plurality of first programmable resistors, the method comprising:

determining a deviation $\varepsilon$ of a second programmable resistor within a control circuit from a value $R_a$, said second programmable resistor having the same structure as said first programmable resistors;

generating a plurality of tuning signals to program said first programmable resistors and said second programmable resistor; and programming at least two of said first programmable resistors as a function of said deviation $\varepsilon$ toward a predetermined value, wherein determining the deviation $\varepsilon$ includes comparing each selected value of the second programmable resistor with a reference value to generate an error signal and count said error signal with a counter to generate said tuning signals, and wherein determining the deviation $\varepsilon$ is based on a formula:

$$R_a = (1+\varepsilon) \cdot (R_{off} + n\delta R)$$

where $R_{off}$ is a resistance that avoids a short circuit when outputs of the counter are low, n is a number of first programmable resistors, and $\delta R$ is a resistance unit.

2. A method for controlling characteristic parameters of an active filter having an operational amplifier, a plurality of first programmable resistors and a plurality of capacitors, the method comprising:

determining a deviation of a second programmable resistor within a control circuit, said second programmable resistor having the same structure as said first programmable resistors;

generating a plurality of tuning signals to program said first programmable resistors and said second programmable resistor; and programming at least two of said first programmable resistors as a function of said deviation toward a predetermined value, wherein determining the deviation includes comparing each selected value of the second programmable resistor with a reference value to generate an error signal and count said error signal with a counter to generate said tuning signals, and wherein programming the at least two of said first programmable resistors includes determining a value of the at least two of said first programmable resistors based on formulas:

$$R1 = \frac{1 \pm \sqrt{1 - 4Q^2(1 + |A_0|)\frac{C2}{C1}}}{2Q\omega|A_0|C_2}$$

$$R2 = \frac{2Q}{\omega C_1 \left(1 \pm \sqrt{1 - 4Q^2(1 + |A_0|)\frac{C2}{C1}}\right)}$$

$$R3 = \frac{1 \pm \sqrt{1 - 4Q^2(1 + |A_0|)\frac{C2}{C1}}}{2Q\omega C2}$$

where R1, R2 and R3 are values of the at least two of said first programmable resistors, C1 and C2 are values of said capacitors, $A_0$ is a gain of the active filter, $\omega$ is a cutoff frequency of the active filter, and Q is a quality factor of the active filter.

3. A method for controlling characteristic parameters of an active filter having an operational amplifier and a plurality of first programmable resistors, the method comprising:

determining a deviation $\epsilon$ of a second programmable resistor within a control circuit, said second programmable resistor having the same structure as said first programmable resistors;

generating a plurality of tuning signals to program said first programmable resistors and said second programmable resistor; and programming at least two of said first programmable resistors as a function of said deviation $\epsilon$ toward a predetermined value, wherein determining the deviation $\epsilon$ includes comparing each selected value of the second programmable resistor with a reference value to generate an error signal and count said error signal with a counter to generate said tuning signals, and wherein programming the at least two of said first programmable resistors includes correcting a value $R_n$ of the at least two of said first programmable resistors based on a formula:

$$R_{nc} = \frac{R_n}{1 + \varepsilon}$$

where $R_{nc}$ is a corrected resistance.

* * * * *